(12) United States Patent  
Chang

(10) Patent No.: US 6,632,587 B2  
(45) Date of Patent: Oct. 14, 2003

(54) METHOD OF ENHANCING PHOTORESIST ANTI-ETCHING ABILITY

(75) Inventor: Ching-Yu Chang, I-Lan (TW)

(73) Assignee: Macronix International Co., Ltd., Hsin-Chu (TW)

( * ) Notice: Subject to any disclaimer, the term of this patent is extended or adjusted under 35 U.S.C. 154(b) by 121 days.

(21) Appl. No.: 09/861,623

(22) Filed: May 22, 2001

(65) Prior Publication Data

US 2002/0177075 A1 Nov. 28, 2002

(51) Int. Cl.[7] ................................................. G03F 7/26
(52) U.S. Cl. ........................ 430/297; 430/296; 430/313; 430/328; 430/942
(58) Field of Search ................................ 430/311, 313, 430/297, 325, 328, 296, 942

(56) References Cited

U.S. PATENT DOCUMENTS 5,660,957 A * 8/1997 Chou ............................. 430/5  
6,358,670 B1 * 3/2002 Wong .......................... 430/296

* cited by examiner

*Primary Examiner*—Kathleen Duda  
(74) *Attorney, Agent, or Firm*—Lowe Hauptman Gilman & Berner LLP

(57) ABSTRACT

A method of enhancing photoresist anti-etching ability, at least includes follows. Provide a substrate, form a photoresist with a pattern on the substrate, put both photoresist and substrate in a low pressure environment, and treat photoresist by an electron beam to let at least part of photoresist is hardened. This method usually is performed before etch process, but the method also could be modified as follows. Expose photoresist by an electron beam while an etching process being performed, or alternately expose photoresist by an electron beam and perform an etch process.

5 Claims, 5 Drawing Sheets

METHOD OF ENHANCING PHOTORESIST ANTI-ETCHING ABILITY

BACKGROUND OF THE INVENTION

1. Field of the Invention

This invention relates generally to method of forming photoresist anti-etching ability, and particularly relates to method for increasing process window and reducing required thickness of photoresist.

2. Description of the Prior Art

For etch process, as FIG. 1A shows, photoresist 12 and etched layer 11 are formed on substrate 10 sequentially, pattern of photoresist 12 defines which part of etched layer 11 would be removed by etch process. Obviously, to ensure etched layer 11 and photoresist 12 have same pattern after etch process is finished, pattern of photoresist 11 should not be changed while etch process being performed.

However, photoresist 12 also is removed by practical etch process, especially edge of opening 13, although removed rate of photoresist 12 usually is obviously smaller than removed rate of etched layer 12. Thus, after etch process is finished, flowing cases may be happened. As FIG. 1B shows, although thickness of photoresist 12 is decreased, pattern of photoresist 12 is correctly transferred into etched layer 11. As FIG. 1C shows, although thickness of photoresist 12 is decreased and pattern of photoresist 12 slightly changed, pattern of photoresist 12 is essentially correctly transferred into etched layer 12. As FIG. 1D shows, both thickness of photoresist 12 is decreased and pattern of photoresist is changed, to let pattern of etched layer 11 is significantly different from pattern of photoresist 12. Indisputably, the more thickness of photoresist 12 is, the more removing rate of photoresist 12 is, the less distance between neighboring opening 13 is, and then the more cases of FIG. 1C or FIG. 1D are, to let assurance of etch process is decreased.

Because pattern of photoresist 12 is dependent on configuration of semiconductor and is not adjustable, also because distance between neighboring openings 13 is decreased while critical dimension is decreased, the most direct solution of previous problem is increasing thickness of photoresist 12. However, whenever thickness of photoresist 12 is increased, difficulty and cost of photolithography also are increased, and then production is decreased. Therefore, increasing thickness is not a general solution for all photoresist 12, especially while both thickness of photoresist 12 and width of opening 13 let aspect ration of opening 13 is too large to be properly formed.

Another often-seen solution is to harden photoresist 12 by ultra-violet light (UV), especially to harden surface of photoresist 12 to let anti-etching ability of photoresist 12 is increased and removed rate of photoresist 12 is decreased. As FIG. 1E and FIG. 1F show, after photoresist 12 is formed and before process is not started, photoresist 12 is exposed by ultra-violet light 14 to let surface of photoresist 12 is transferred to hardened photoresist 15. After that, etch process is performed by using both photoresist 12 and hardened photoresist 15 as required mask. Because removed rate of hardened photoresist 15 is smaller than removed rate of photoresist 12, after etch process is finished, thickness of both residual hardened photoresist 15 and residual photoresist 12 is smaller than thickness of residual photoresist 12 which is not hardened. Thus, disadvantages such as thinner photoresist 12 and changed pattern could be effectively improved.

However, while photoresist 12 is hardened by ultra-violet light, following disadvantages still are unavoidable. First, ultra-violet light 14 only could harden surface of photoresist 12 and then thickness of hardened photoresist 15 is finite, thus, photoresist 12 still must be thick enough to ensure pattern could be accurately transferred after hardened photoresist 12 is totally consumed. Second, glow discharge of etching process is in the range of near ultra-violet light, which would reduce thermal stability of both photoresist 12 and hardened photoresist 15 and induce unavoidable deformation. Third, absorb efficiency of ultraviolet light depends on material of photoresist 12 and then different material requires different wavelength of ultra-violet light, thus, not only fabrication is complicated for wavelength of ultra-violet light must be adjusted but also some materials of photoresist could not be properly hardened by ultra-violet light. Fourth, temperature of expose process under ultra-violet light is high, shape of photoresist 12 maybe changed. Fifth, power of ultra-violet light is low for most available ultra-violet sources of practical fabrication line, then required period for exposing under ultra-violet light is long and efficiency of fabrication line is decreased.

In short, each of current technologies for solving consumption of photoresist during etch process is not perfect, and then it is desired to develop new technology for enhancing anti-etching ability of photoresist.

SUMMARY OF THE INVENTION

One main object of this invention is to present method of forming photoresist anti-etching ability.

Another main object of this invention is to present a method for increasing process window and reducing required thickness of photoresist.

Still one main object of this invention is to present a method of etching with anti-etching photoresist.

This present invnetion provides a method of enhancing photoresist anti-etching ability, especially is a method which is performed before etch process, at least includes follows. Provide a substrate and form a photoresist with a pattern on the substrate, then put both photoresist and substrate in a low pressure environment, and then treat photoresist by an electron beam to let at least part of photoresist is hardened. After photoresist is treated by electron beam, photoresist is hardened and has anti-etch ability, thus, precision of etch process is enhanced and corresponding pattern is more precise.

Other preferred embodiments are methods of etching with anti-etching photoresist. One embodiment at least includes follows. Provide a substrate, wherein a patterned photoresist is located on, and simultaneously perform an electron beam expose process and an etch process, wherein electron beam exposes process exposes patterned photoresist by electron beam and etch process uses patterned photoresist as a mask. Another embodiment at least includes follows. Provide a substrate, wherein a patterned photoresist is located on, and alternately perform numerous electron beam expose process and numerous etch process, wherein electron beam exposes process exposes patterned photoresist by electron beam and etch process uses patterned photoresist as a mask. Obviously, in both previous embodiments. Hardened photoresist is continuously consumed but also is continuously formed.

BRIEF DESCRIPTION OF THE DRAWINGS

A more complete appreciation and many of the attendant advantages will be readily obtained as the same becomes better understood by reference to the following detailed description when considered in connection with the accompanying drawings.

DESCRIPTION OF THE PREFERRED EMBODIMENT

Because disadvantages discussed above are almost unavoidable while ultra-violet light is used to harden photoresist, but hardened photoresist is a better solution than both increasing thickness of photoresist and modifying material of photoresist to reduce effect induced by removed photoresist during etch process. This claimed invention present a method for hardening photoresist without application of ultra-violet light.

This present invention uses electron beam, such as electron beam emitted from high-energy electron gun, to harden photoresist, especially to harden photoresist in a low-pressure environment. Because available materials usually are polymers, electron beam could break original bonds of polymer molecules and increases the probability that neighboring polymer molecules are bonded with each other, thus, cross-link between different polymer molecules are increased by incident electron beam. Besides, kinetic energy of incident electrons would be transferred into thermal energy while incident electrons collide with photoresist and induces equivalent effect of bake. Moreover, low-pressure environment not only reduces scattering probability to ensure electron beam could effectively expose photoresist but also increases hardness of photoresist by enhancing evaporation of solvent in photoresist.

To compare well-known technology which uses ultra-violet light to harden photoresist, this present invention which uses electron beam to harden photoresist at least has following advantages. First, electron beam would not interfere with ultra-violet light, near ultra-violet light, or deep ultra-violet light, and then glow discharge appeared during etch process would not affect photoresist. Next, because electron beam induce cross-link by collisions between incident electrons and molecules of photoresist, absorbing rate of electron beam does not obviously vary among different materials of photoresist, especially while different photoresists are made of polymers, thus, fabrication is simplified for used electron beam needs not to be adjusted while material of photoresist is changed. Moreover, for current fabrication line, power of available electron beam source is larger than power of ultra-violet light source, and then production is increased while ultra-violet light is replaced by electron beam. Of course, because electronic beam also essential only harden surface of photoresist, thickness of hardened photoresist still is finite and then thickness of photoresist still must be thick enough to ensure accurately transference of pattern while hardened photoresist is totally consumed.

One preferred embodiment of this invention is a method of enhancing photoresist anti-etching ability, at least includes follows.

Figure 1A:
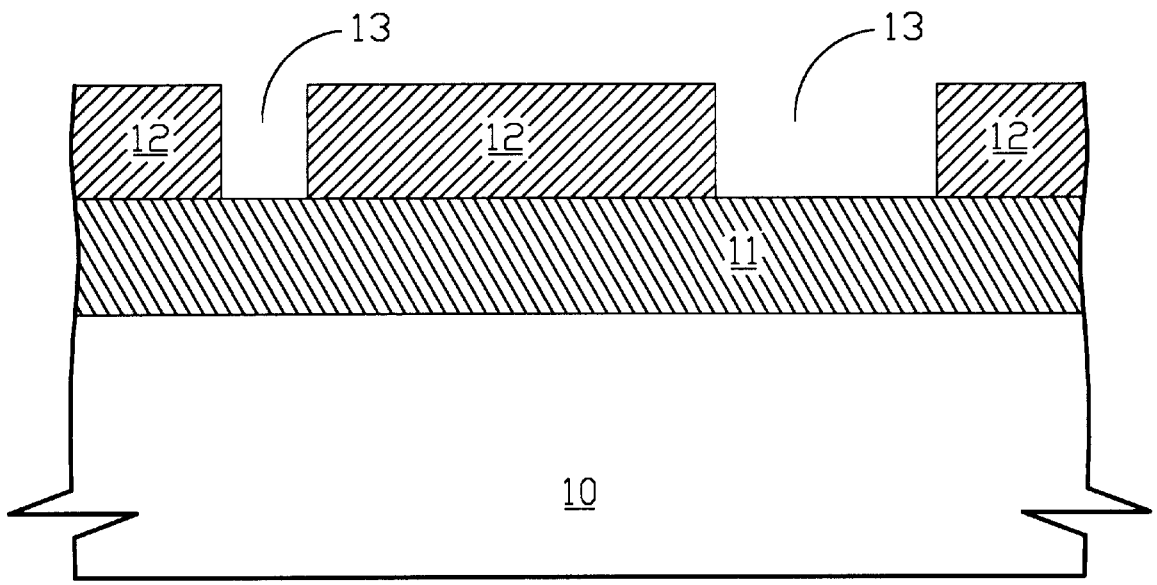
FIG. 1A through FIG. 1D are cross-sectional illustrations for showing effect of removed photoresist during etch process.
Figure 1B:
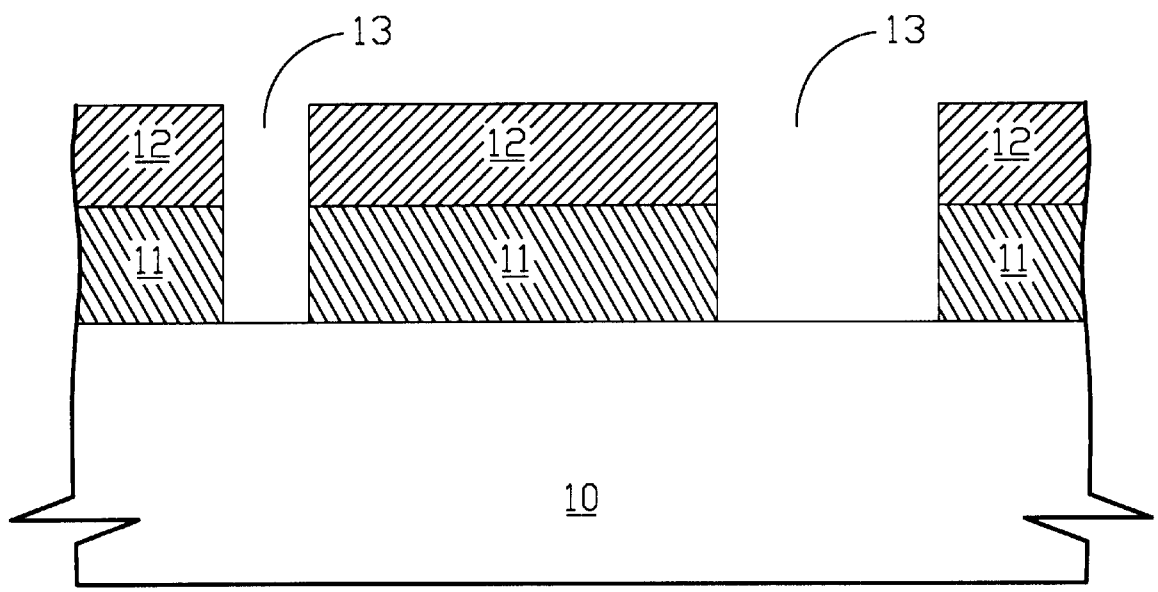
Figure 1C:
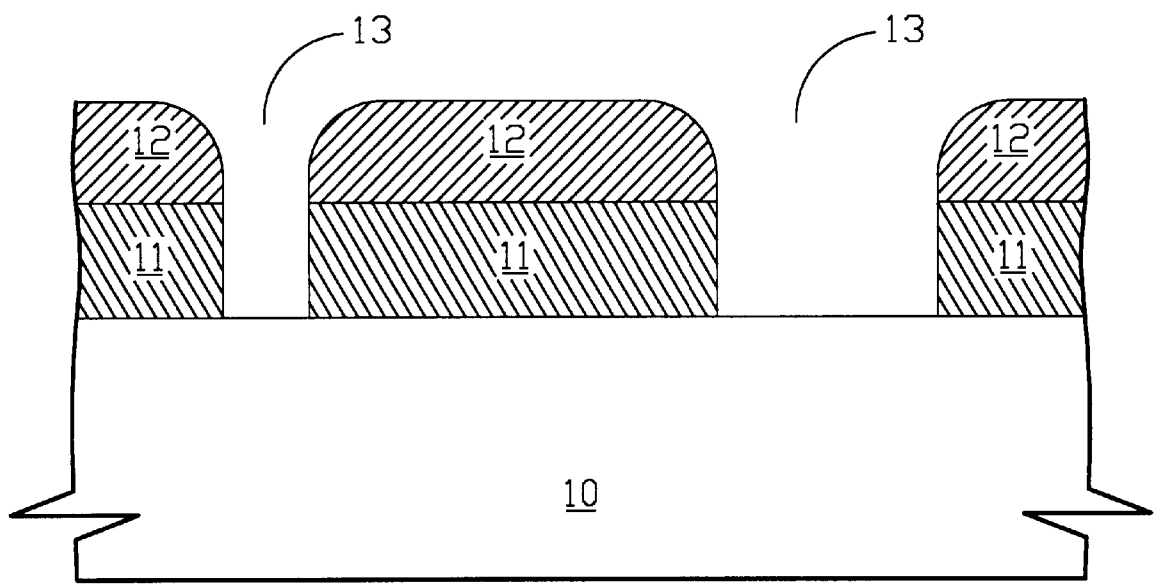
Figure 1D:
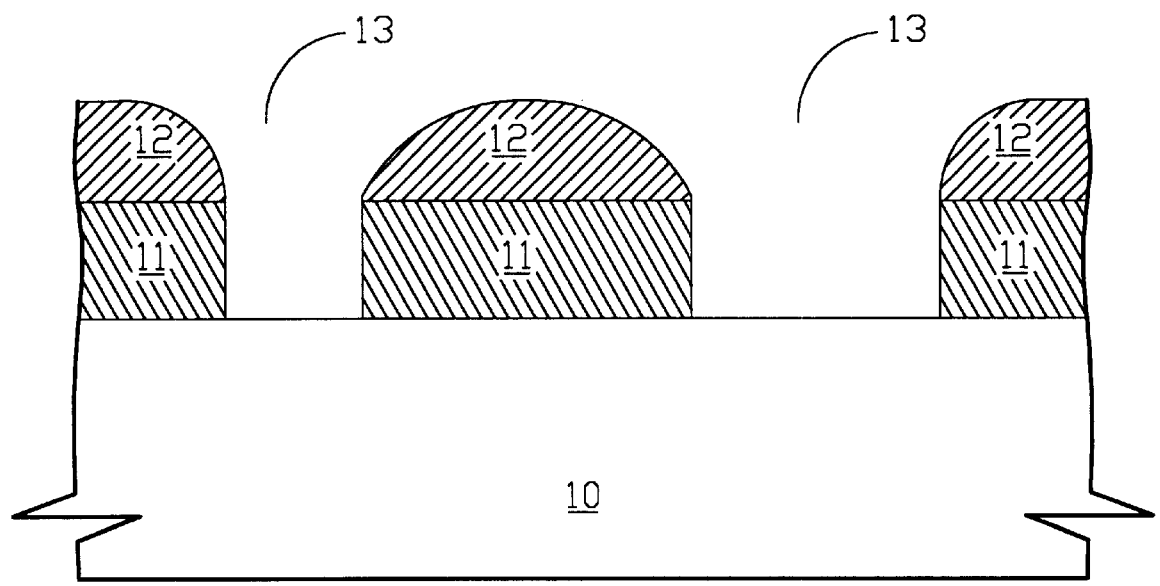
Figure 1E:
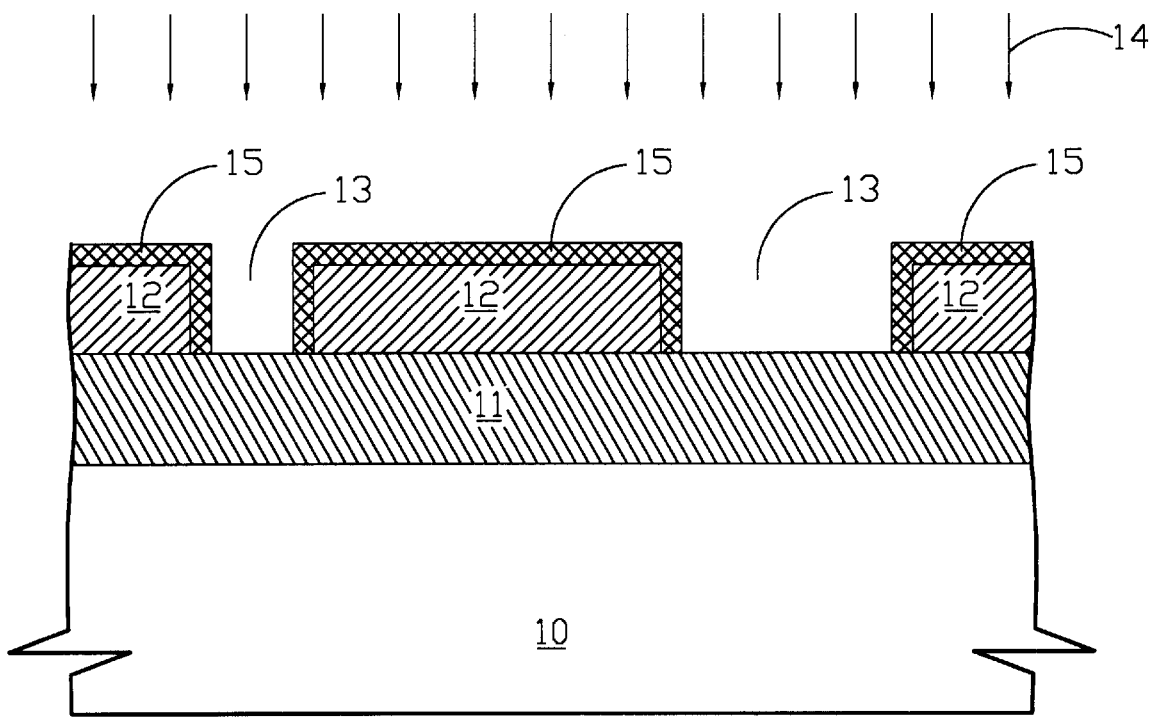
FIG. 1E through FIG. 1F are cross-sectional illustrations for showing how photoresist is hardened to reduce effect of removed photoresist during etch process.
Figure 1F:
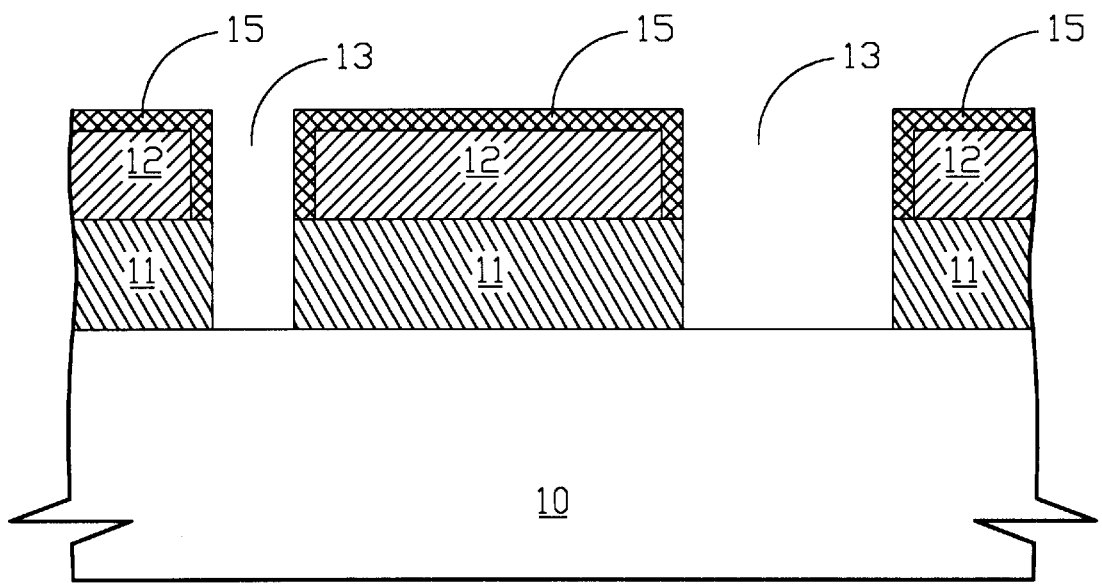
Figure 2A:
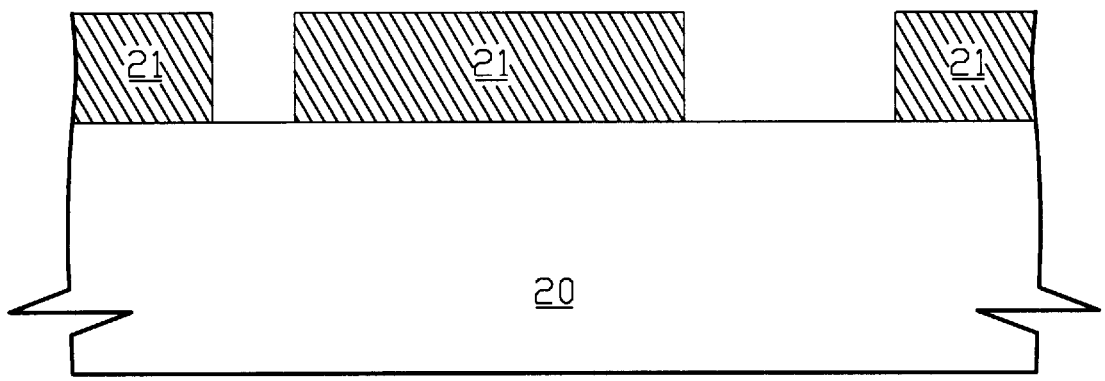
FIG. 2A through FIG. 2B are two cross-sectional illustrations of essential steps of one preferred embodiment of present invention.

As FIG. 2A shows, provide substrate 20 and form photoresist 21 with a pattern on substrate 20, then put both photoresist 21 and substrate 20 in a low-pressure environment. As usual, photoresist 21 and substrate 20 are put in a reactor which is pumped. Herein, photoresist 21 could be PVV photoresist, PNS 1240, or any commercial photoresist. Moreover, pressure of low-pressure environment usually is less than 500 torr and a possible value is about 0.1 torr to 1 torr. In fact, pressure only is required to be enough low to let electron beam could properly expose photoresist in sequentially process.

Figure 2B:
Figure 2B:
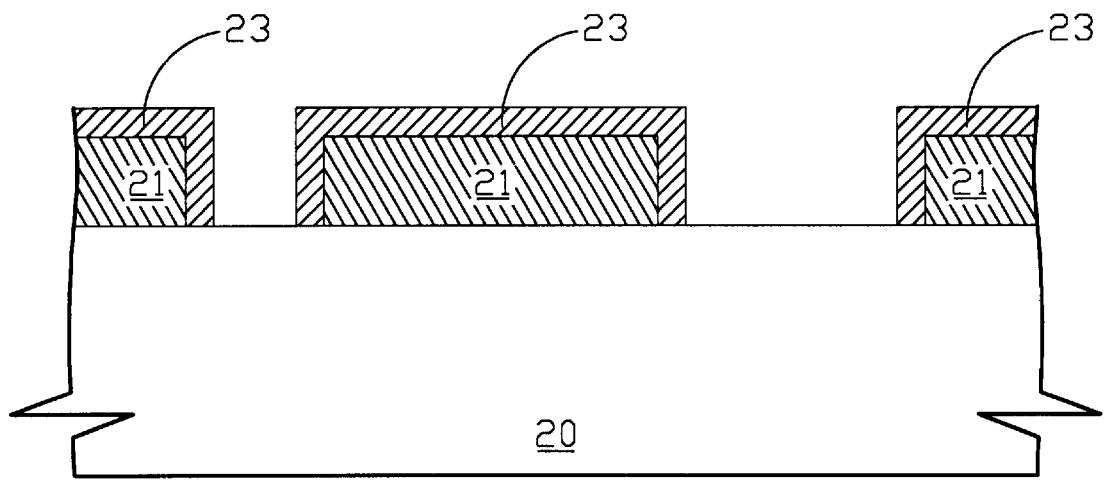

As FIG. 2B shows, treat photoresist by an electron beam to let at least part of photoresist is hardened and transferred to hardened photoresist 23. The higher power of electron beam 22 is, the higher hardened velocity of photoresist 21 is and the high hardness of hardened photoresist 23 is. Although power of electron beam 22 usually is about 100 meV, but this embodiment is not limited by what power is. For example, electron beam 22 could be the electron beam 22 used by scanning electron microscope to measure critical dimension.

Further, because electron beam only harden surface of photoresist, just as ultra-violet light, expose by electron beam could be terminated while surface of photoresist has been totally hardened. In fact, expose by electron beam could be terminated while thickness of hardened photoresist is thick enough to let pattern of photoresist would not be changed during following etch process. For example, thickness of hardened photoresist maybe only about one percent of thickness of original photoresist.

However, method of hardening photoresist by electron beam still could not effectively overcome the disadvantage that hardened photoresist still would be removed by etch process. Thus, both hardened photoresist and non-hardened photoresist could be totally removed during etch process, and then thickness of photoresist still needs to be thick enough to ensure pattern of photoresist could be accurately transferred into underlying substrate. Aims at this problem, this invnetion further includes two modifications to ensure hardened photoresist would not be totally consumed during etch process.

Figure 3A:
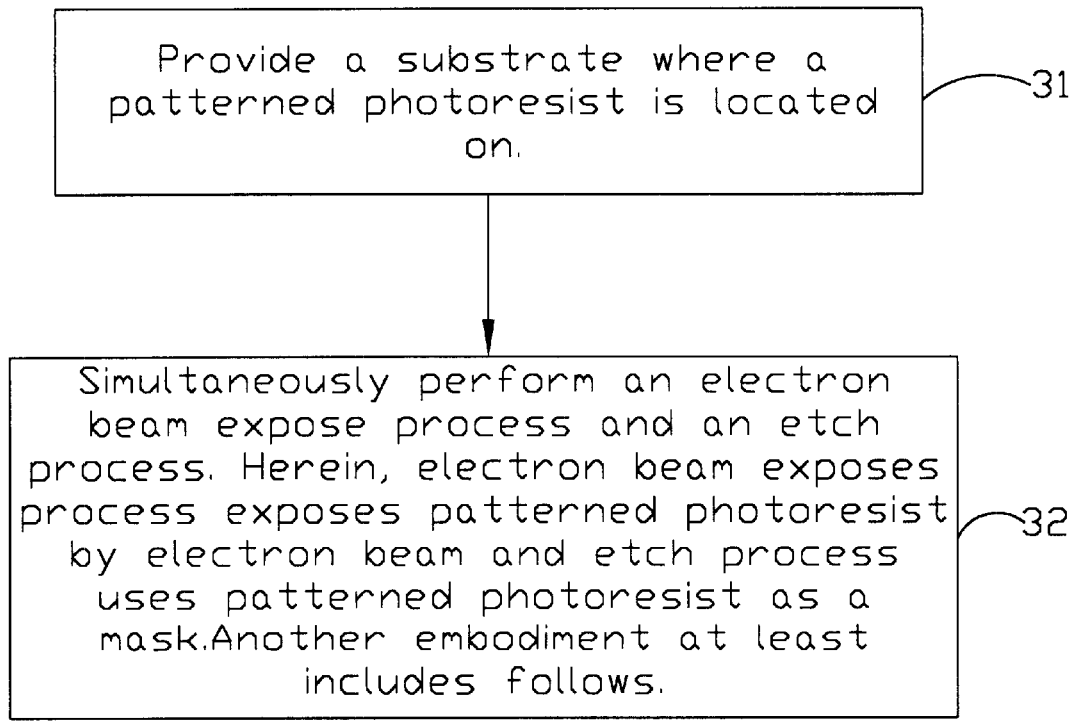
FIG. 3A through FIG. 3B are two essential flow-chart of two preferred embodiments of resent invention.

Another preferred embodiment is a method of etching with anti-etching photoresist, as FIG. 3A shows, this embodiment at least includes following essential steps:

As photoresist block 31 shows, provide a substrate where a patterned photoresist is located on.

As simultaneously treat block 32 shows, simultaneously perform an electron beam expose process and an etch process. Herein, electron beam exposes process exposes patterned photoresist by electron beam and etch process uses patterned photoresist as a mask. Another embodiment at least includes follows.

In this embodiment, substrate usually is put in a low pressure environment before both electron beam expose process and etch process is performed. Besides, electron beam expose process could be stopped whenever surface of photoresist is totally hardened or whenever thickness of hardened photoresist is thick enough to ensure pattern of photoresist would not be changed during etch process. As usually, thickness of hardened photoresist is about one percent of thickness of patterned photoresist.

Figure 3B:
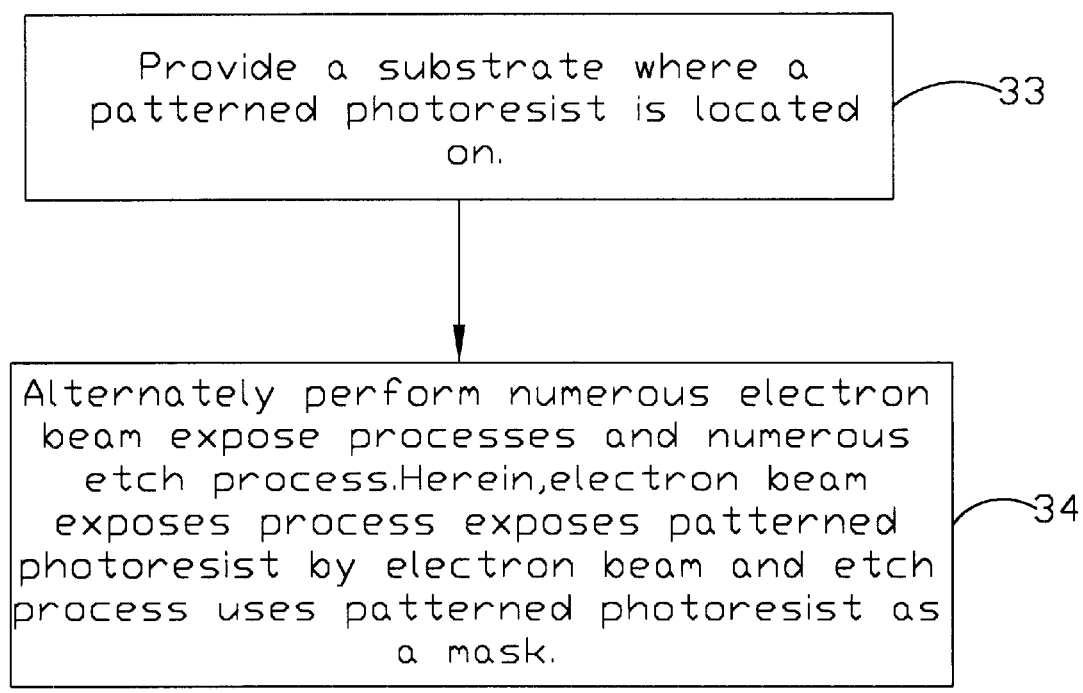

The other preferred embodiment also is a method of etching with anti-etching photoresist, as FIG. 3B shows, this embodiment at least includes following essential steps:

As photoresist block 33 shows, provide a substrate where a patterned photoresist is located on.

As alternately treat block 34 shows, alternately perform numerous electron beam expose processes and numerous etch process. Herein, electron beam exposes process exposes patterned photoresist by electron beam and etch process uses patterned photoresist as a mask.

Herein, substrate also usually is located in a low pressure environment before electron beam expose processes and etch processes are performed. Moreover, each electron beam expose process does not need to totally harden surface of said patterned photoresist, and each etch process also does not totally transferred pattern of photoresist to substrate. In fact, each electron beam expose processes only requires to harden part of patterned photoresist where thickness of hardened part must be thick enough to let pattern of patterned photoresist is not changed during following etch process.

From the foregoing it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. A method of etching with anti-etching photoresist, comprising:

providing a substrate, wherein a patterned photoresist is located on said substrate; and simultaneously performing an electron beam expose process and an etch process, wherein said electron beam exposes process exposes said patterned photoresist and said etch process uses said patterned photoresist as a mask.

2. The method of claim 1, wherein both said electron beam expose process and said etch process are performed in a low-pressure environment.

3. The method of claim 1, wherein said electron beam expose process is terminated after surface of said patterned pattern is hardened.

4. The method of claim 3, wherein thickness of hardened part of said patterned photoresist is about one percent of original thickness of said patterned photoresist.

5. The method of claim 1, wherein said electron beam expose process is stopped whenever the thickness of the hardened portion of said patterned photoresist is thick enough to ensure the pattern of said patterned photoresist would not be changed during the etch process.

* * * * *